(12) United States Patent
Lee et al.

(10) Patent No.: US 8,012,831 B2
(45) Date of Patent: Sep. 6, 2011

(54) METHOD OF FORMING ISOLATION LAYER OF FLASH MEMORY DEVICE

(75) Inventors: Sang Soo Lee, Seoul (KR); Cha Deok Dong, Icheon-si (KR); Hyun Soo Shon, Suwon-si (KR); Woo Ri Jeong, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 937 days.

(21) Appl. No.: 11/954,177

(22) Filed: Dec. 11, 2007

(65) Prior Publication Data

US 2008/0280441 A1    Nov. 13, 2008

(30) Foreign Application Priority Data

May 11, 2007    (KR) .................. 10-2007-0045974

(51) Int. Cl.
*H01L 21/8247*    (2006.01)
(52) U.S. Cl. ................. 438/264; 257/E21.179; 438/296
(58) Field of Classification Search .......... 438/257–267, 438/296; 257/E21.179
See application file for complete search history.

(56) References Cited

U.S. PATENT DOCUMENTS

| 5,858,830 | A | * | 1/1999 | Yoo et al. | 438/241 |
| 6,013,551 | A | * | 1/2000 | Chen et al. | 438/264 |
| 6,153,472 | A | * | 11/2000 | Ding et al. | 438/264 |
| 6,171,909 | B1 | * | 1/2001 | Ding et al. | 438/267 |

FOREIGN PATENT DOCUMENTS

| KR | 10-2001-0055525 | 7/2001 |
| KR | 10-2004-0052328 | 6/2004 |
| KR | 10-2004-0053441 | 6/2004 |

* cited by examiner

*Primary Examiner* — Richard A. Booth
(74) *Attorney, Agent, or Firm* — Marshall, Gerstein & Borun LLP

(57) ABSTRACT

An embodiment of the invention relates to a method of forming an isolation layer of a flash memory device. An isolation layer is formed using a PSZ-based material and a nitride film of liner form is deposited on a trench before the PSZ film is deposited. An oxide film can be prevented from remaining on a top of the sidewalls of a conductive film for a floating gate through an etch process employing the etch rate. The thickness of a dielectric film can be prevented from increasing when a dielectric film is deposited. Accordingly, the contact area of the floating gate and the dielectric film can be increased and the coupling ratio between the floating gate and the control gate can be improved.

17 Claims, 4 Drawing Sheets

METHOD OF FORMING ISOLATION LAYER OF FLASH MEMORY DEVICE

CROSS-REFERENCES TO RELATED APPLICATIONS

This invention claims priority to Korean patent application number 10-2007-45974 filed on May 11, 2007, the disclosure of which is incorporated by reference in its entirety.

TECHNICAL FIELD

This invention relates to a method of forming an isolation layer of a flash memory device and, more particularly, to a method of forming an isolation layer of a flash memory device with improved coupling ratio between a floating gate and a control gate.

BACKGROUND OF THE INVENTION

In general, the thickness of a dielectric film plays an important role in deciding the coupling ratio of flash memory. However, as devices are highly integrated, there is a tendency that the thickness of a dielectric film gradually decreases. Further, it becomes more difficult to form an isolation layer by fully gap filling a trench without voids using a High Density Plasma (HDP) oxide film, which was used conventionally, because the Critical Dimension (CD) of the trench decreases.

A method of fully gap filling a trench using spin on dielectric (SOD) materials, for example, polysilazane (PSZ) is employed. The PSZ material has a property in which it flows like water due to a low viscosity, and therefore is capable of fully gap fill the trench. However, the PSZ material contains high amounts of impurities and moisture. If the PSZ material is formed adjacent to a tunnel insulating film, the tunnel insulating film degrades. Due to this, a HDP oxide film used as a liner form layer is formed on a surface of the trench in order to prevent the tunnel insulating film from being contaminated due to impurities contained within the PSZ material.

On the other hand, if the HDP oxide film is formed under the PSZ film, the HDP oxide film formed on the sidewalls of a conductive film may not be properly removed. A portion of the HDP oxide film may remain after an etching process for securing the Effective Field oxide Height (EFH) of an isolation layer because the HDP oxide film has a lower etch rate than the PSZ material. The contact area of a floating gate and a dielectric film is thus decreased by the HDP oxide film remaining on the sidewalls of the conductive film in a subsequent deposition process of a dielectric film, so that the coupling ratio reduces. The reduced coupling ratio leads to decreased program speed.

Meanwhile, if a wet etch process is performed additionally in order to remove the HDP oxide film remaining on the sidewalls of the conductive film, the EFH of the isolation layer is further lowered and the tunnel insulating film is attacked accordingly. Consequently, the device is degraded and reliability of the device is lowered.

BRIEF SUMMARY OF THE INVENTION

This invention is directed to a method of forming an isolation layer of a flash memory device with improved coupling ratio between a floating gate and a control gate. The improved coupling ratio provides increased contact area of a conductive film for the floating gate and a dielectric film, thereby preventing an oxide film from remaining on the sidewalls of the conductive film for the floating gate.

In an embodiment of the invention, a method of forming an isolation layer of a flash memory device includes providing a semiconductor substrate in which a tunnel insulating film, a conductive film, and a first insulating film are formed in an active region, and a trench is formed in an isolation region, forming a sidewall insulating film, a second insulating film, and a third insulating film so that the trench is gap filled, thus forming the isolation layer, removing the first insulating film, wherein a top surface of the third insulating film and a top surface of the second insulating film are etched together, so that the top surfaces of the third insulating film and the sidewall insulating film remain in a projected shape, and performing an etch process so that a top of sidewalls of the conductive film is exposed as the projections of the third insulating film and the sidewall insulating film are removed.

In an embodiment of the invention, an isolation layer is formed using a PSZ-based material. A nitride film of liner form is deposited on the trench before the PSZ film is deposited. Accordingly, an oxide film may be prevented from remaining on top of the sidewalls of the conductive film for a floating gate through an etching process employing the etch rate.

In an embodiment of the invention, the oxide film can be prevented from remaining on the top of the sidewalls of the conductive film for the floating gate and, therefore, the thickness of a dielectric film can be prevented from increasing when the dielectric film is deposited. Accordingly, a contact area of the floating gate and the dielectric film may be increased and the coupling ratio between the floating gate and the control gate may be improved.

In an embodiment of the invention, the isolation layer may be easily gap filled by filling the trench with the PSZ film.

In an embodiment of the invention, an A-shaped EFH is secured to a desired height using a cleaning process. A profile having a wing spacer form is formed on the sidewalls of the conductive film for the floating gate. Accordingly, an interference phenomenon between cells may be improved and reliability of a device may be improved.

The sidewall insulating film is formed to a thickness of approximately 20 to 100 angstrom using an oxidization process of a radical method. The second insulating film is formed using a nitride film so that an underlying region of the trench is partially gap filled, and is formed to a thickness of approximately 50 to 300 angstrom.

The third insulating film is formed from polysilazane (PSZ) using a spin coating method, and is formed to a thickness of 3000 to 6000 angstrom in a temperature range of 350 to 400 degrees Celsius. The method further includes performing a curing process in order to densify the third insulating film after the third insulating film is formed. The curing process is performed in a temperature range of 300 to 500 degrees Celsius using a Catalythic Water Vapor Generator (c-WVG) method.

The method further includes, after the third insulating film is formed, etching the sidewall insulating film and the second and third insulating films using a Chemical Mechanical Polishing (CMP) process in order to form the isolation layer, and performing first and second curing processes after the isolation layer is formed. The first curing process is performed at a temperature ranging from 550 to 700 degrees Celsius using a c-WVG method, and the second curing process is performed at a temperature ranging from 850 to 1000 degrees Celsius under a $N_2$ gas atmosphere.

The first insulating film is removed by a wet etch process using a mixed solution of Buffered Oxide Etchant (BOE) and $H_3PO_4$. The projections of the third insulating film and the sidewall insulating film are removed using BOE. The method further includes performing a cleaning process after the process of removing the sidewall insulating film of the projected shape. At the time of the cleaning process, the third insulating film is etched, so that an Effective Field oxide Height (EFH) of the isolation layer is controlled. The cleaning process is performed using a HF solution in which H20:HF are mixed in a ratio of approximately 100:1 to 500:1.

DETAILED DESCRIPTION

Hereinafter, a method of forming an isolation layer of a flash memory device in accordance with preferred embodiments of the invention will be described in detail with reference to the accompanying drawings. It is to be noted that although the invention is described herein in relation to a cell region, the same process steps may be performed on a peripheral region.

Figure 1A:
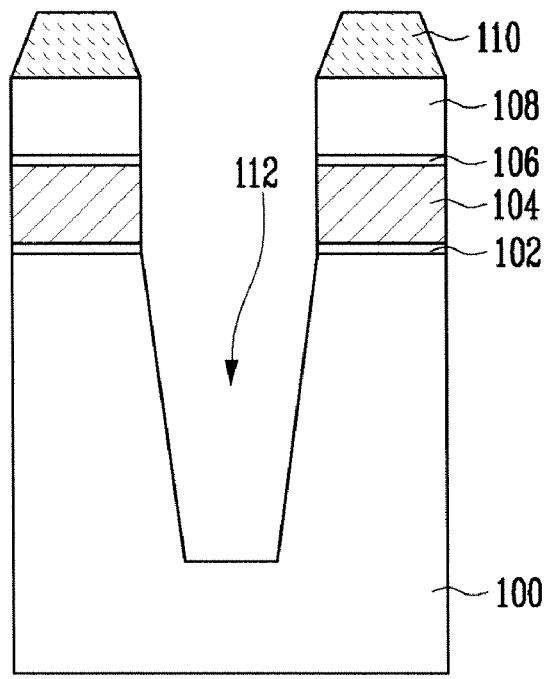
FIGS. 1a to 1h are sectional views illustrating a method of forming an isolation layer of a flash memory device according to an embodiment of the invention.

Referring to FIG. 1a, a tunnel insulating film 102, a first conductive film 104, a buffer insulating film 106 and a first insulating film 108 are formed in an active region. A semiconductor substrate 100 in which a trench 112 is formed is provided in an isolation region.

The tunnel insulating film 102 may be formed, for example, from silicon oxide ($SiO_2$) by, for example, an oxidation process. The tunnel insulating film 102 may be preferably formed to a thickness of approximately 70 to 80 angstrom by a wet oxidization process. In order to reduce trap density and improve reliability, nitrogen (N) may be included in the tunnel insulating film 102 through a subsequent annealing process, which is performed under, for example, a nitrous oxide ($N_2O$) or nitric oxide (NO) gas atmosphere. The first conductive film 104 is used as a floating gate of a flash memory device, and may be formed, for example, using a polysilicon film, a metal film or a stack film of them, preferably a doped polysilicon film. More preferably, the first conductive film 104 may have a stack structure of an undoped polysilicon film and a doped polysilicon film in order to lower the concentration of phosphorous (P) at the interface of the tunnel insulating film 102 and the floating gate 104. The first conductive film 104 may be formed to a thickness of approximately 300 to 1500 angstrom at a temperature ranging from 500 to 550 degrees Celsius.

The buffer insulating film 106 may be formed, for example, from silicon oxide ($SiO_2$). The first insulating film 108 may be formed, for example, from a nitride-based material in order to be used as an etch-stop film in a subsequent chemical mechanical polishing (CMP) process, for example, for forming an isolation layer. The first insulating film 108 may be formed to a thickness of approximately 300 to 1000 angstrom by, for example, a low-pressure chemical vapor deposition (LPCVD) method. A hard mask film 110 used as an etch mask may be further formed on the first insulating film 108 in order to prevent loss of a top surface of the first conductive film 104 when the trench 112 is formed. The buffer insulating film 106 and the hard mask film 110 may be formed to a thickness of approximately 30 to 100 angstrom and approximately 100 to 400 angstrom, respectively, for example, using an oxide film by, for example, a LPCVD method.

The trench 112 is formed by etching the hard mask film 110, the first insulating film 108, the buffer insulating film 106, the first conductive film 104 and the tunnel insulating film 102 of the isolation region by, for example, an etching process using a mask (not shown) and then etching an exposed semiconductor substrate 100 of the isolation region to a predetermined depth.

Figure 1B:
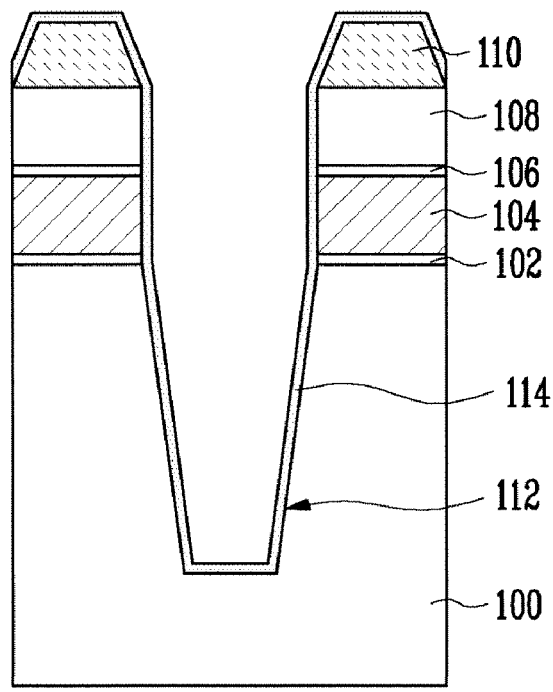

Referring to FIG. 1b, a sidewall insulating film 114 is formed on a surface of the semiconductor substrate 100, including the trench 112. The sidewall insulating film 114 may be formed to a thickness of approximately 20 to 100 angstrom by, for example, an oxidization process of a radical method to compensate for damage occurred during the trench etching process and may minimize a smiling phenomenon that occurs at both ends of the tunnel insulating film 102.

Figure 1C:
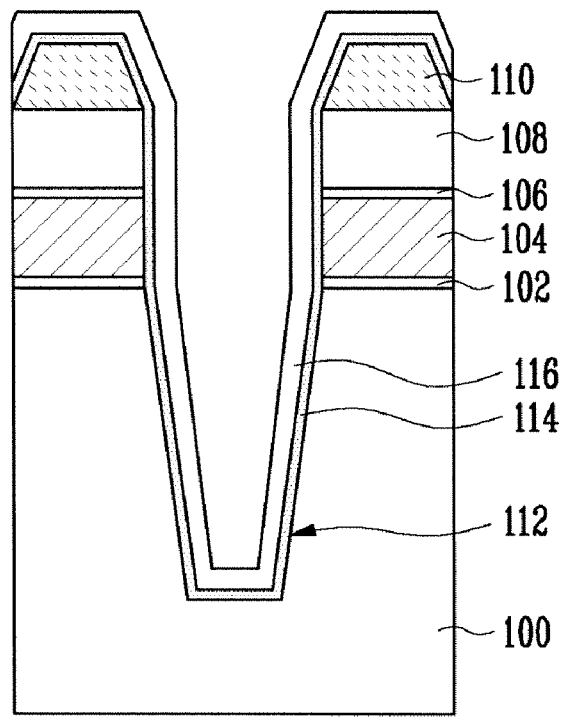

Referring to FIG. 1c, a second insulating film 116 may be used as a liner form layer and is formed on the sidewall insulating film 114. The second insulating film 116 may be formed, for example, using a nitride film, such that the second insulating film 116 and the first insulating film 108 are etched together in a subsequent etching process. The second insulating film 116 may be formed to a thickness of approximately 50 to 300 angstrom by, for example, a LPCVD method.

If the second insulating film 116 is formed using the nitride film as described above, not only the insulating film can be prevented from remaining on the sidewalls of the first conductive film 104 in the subsequent etching process employing an etch rate, but also contact of the tunnel insulating film 102 and a PSZ film 118 (See FIG. 1d) containing high levels of impurities and moisture can be prohibited in a subsequent process of forming the PSZ film. Thus, the tunnel insulating film 102 can be prevented from being contaminated due to impurities.

Figure 1D:
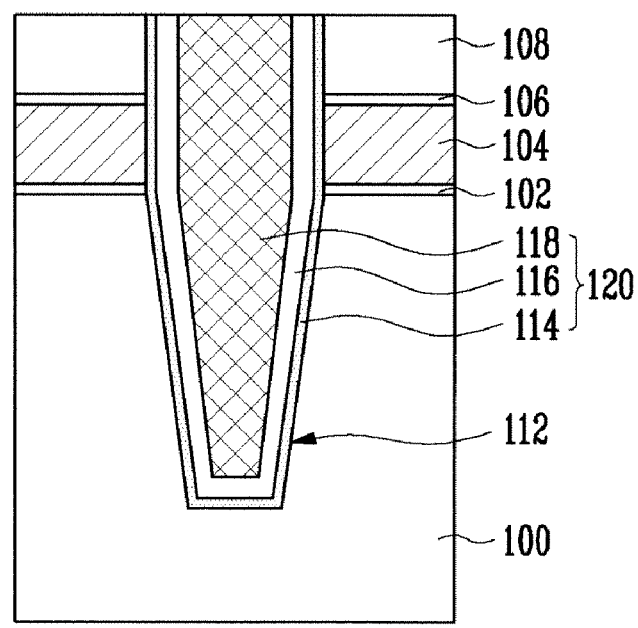

Referring to FIG. 1d, a third insulating film 118 is formed on the second insulating film 116 to gap fill the trench 112. The third insulating film 118 may be formed to a thickness of approximately 3000 to 6000 angstrom, for example, using PSZ film by, for example, a spin coating method at a temperature ranging from 350 to 400 degrees Celsius.

A curing process, for example, is performed after the process of forming the PSZ film in order to remove the PSZ film containing impurities and moisture and to increase the etch rate. The curing process may be performed by, for example, a catalytic water vapor generator (c-WVG) method at a temperature ranging from 300 to 500 degrees Celsius.

At least a portion of the third insulating film 118, the second insulating film 116, and the sidewall insulating film 114 are removed by performing, for example, a CMP process until the surface of the first insulating film 108 is exposed. As shown in FIG. 1d, the sidewall insulating film 114, the second insulating film 116 and the third insulating film 118 are remained within the trench 112, thus forming an isolation layer 120.

To densify and control the PSZ film 118 to have a higher etch rate than the HDP film, a second and third curing processes are performed. The second curing process may be performed, for example, using the c-WVG method at a temperature ranging from 550 to 700 degrees Celsius. The third curing process may be performed at a temperature ranging from 850 to 1000 degrees Celsius under, for example, a $N_2$ gas atmosphere. A smiling phenomenon can be prevented from occurring at both ends of the tunnel insulating film 102.

Figure 1E:
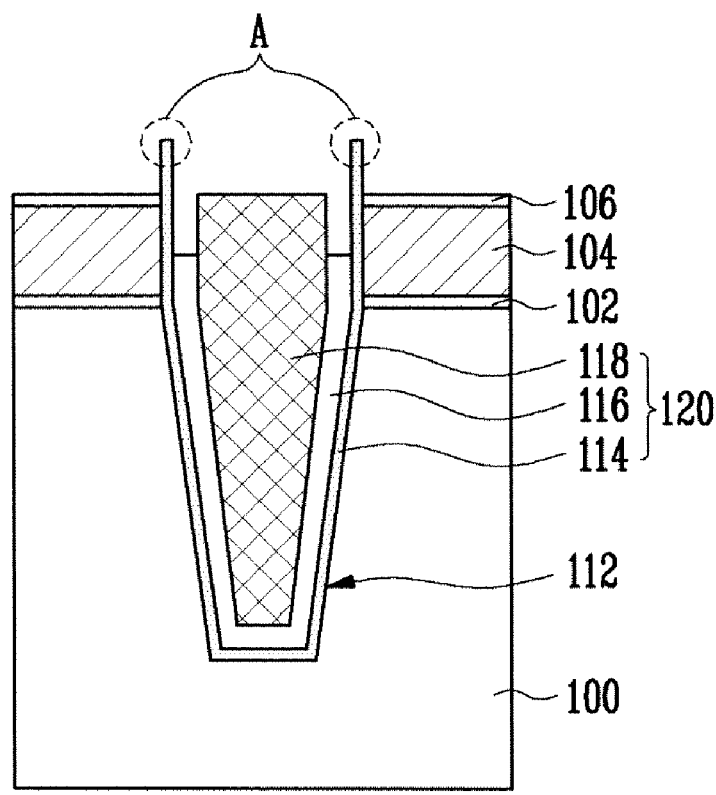

Referring to FIG. 1e, the first insulating film 108 is removed, for example, by a wet etching process, until a top surface of the buffer insulating film 106 is exposed. The first insulating film 108 may be removed, for example, using a mixed solution of buffered oxide etchant (BOE) and phosphoric acid ($H_3PO_4$). During the etching process, the second insulating film 116 and the third insulating film 118 are partially etched. The second insulating film 116 having an etch rate similar to the first insulating film 108 is etched more than the third insulating film 118. Thus, an external wall of the third insulating film 118 is partially exposed and therefore a top surface of the third insulating film 118 is projected. Meanwhile, the sidewall insulating film 114 is not removed because of a difference in the etch rate, but remains in a projected shape A.

Figure 1F:
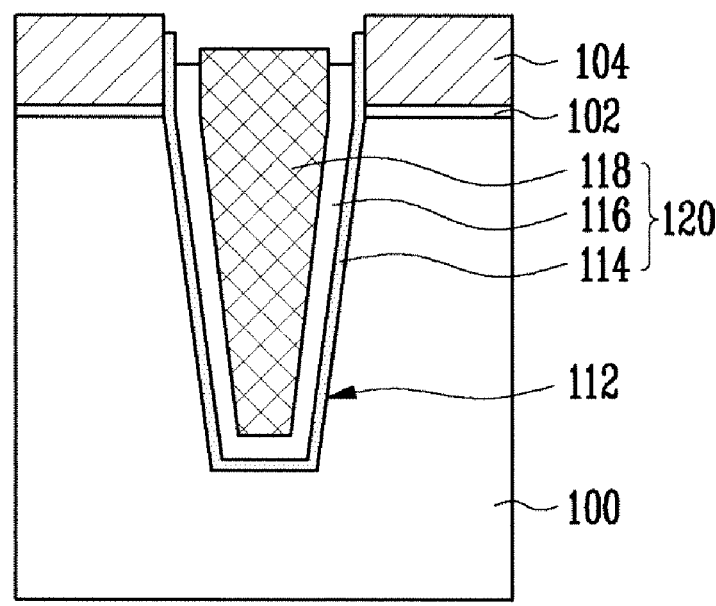

Referring to FIG. 1f, the buffer insulating film 106 is removed, for example, by a wet etch process, until a top surface of the first conductive film 104 is exposed. The buffer insulating film 106 may be removed, for example, using BOE. During the etching process, the sidewall insulating film 114 and the third insulating film 118, having an etch rate similar to that of the buffer insulating film 106, are also partially etched. Accordingly, as the projections A of the sidewall insulating film 114 are removed, the external wall of the first conductive film 104 is partially exposed.

Figure 1G:
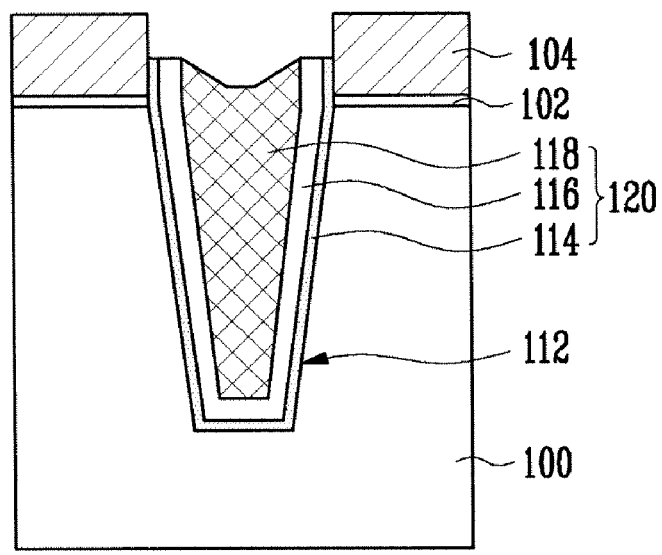

Referring to FIG. 1g, a cleaning process, for example, is performed. The top surface of the third insulating film 118 is partially etched and the EFH of the isolation layer 120 is controlled to a desired height. As the sidewall insulating film 114 is partially etched, the external wall of the first conductive film 104 is further exposed. The cleaning process may be performed, for example, using a HF solution where $H_2O$:HF are mixed in a ratio of approximately 100:1 to 500:1. An A-shaped EFH is secured by removing the sidewall insulating film 114 remaining on the sidewalls of the first conductive film 104 in the projected shape A by employing the difference in the etch rate of the nitride film, the PSZ film, and the oxide film. Accordingly, an interference phenomenon between cells can be improved and a charge retention characteristic can be improved.

Figure 1H:
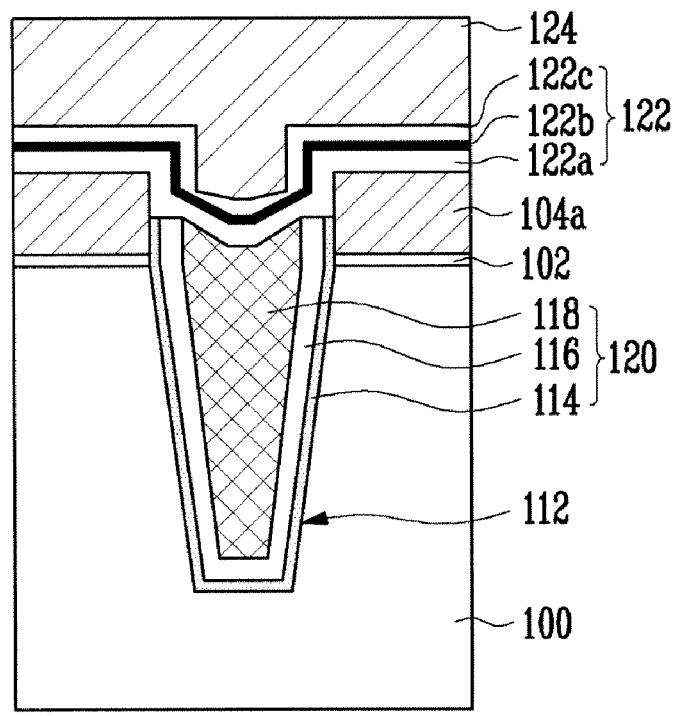

Referring to FIG. 1h, a dielectric film 122 and a second conductive film (not shown) are formed over the semiconductor substrate 100, including the first conductive film 104 and the isolation layer 120. The dielectric film 122 may have, for example, a stack structure of oxide-nitride-oxide, including a first oxide film 122a, a nitride film 122b, and a second oxide film 122c. The second conductive film 124 is used as a control gate of a flash memory device, and may be formed, for example, using a polysilicon film, a metal film or a stack film of them, preferably a polysilicon film.

The second conductive film, the dielectric film 122, and the first conductive film are patterned, for example, using a typical etching process, thus forming a floating gate 104a. As shown for the embodiment, the floating gate 104a includes the first conductive film 104 and a control gate 124 includes the second conductive film. A gate pattern having a stack structure of the tunnel insulating film 102, the floating gate 104a, the dielectric film 122, and the control gate 124 is thereby completed. A contact area of the floating gate 104a and the dielectric film 122 may be increased, thereby improving the coupling ratio between the floating gate 104a and the control gate 124.

Although preferred embodiments of the invention have been disclosed for illustrative purposes, it is to be understood that changes and modifications of the present invention may be made by the ordinary skilled in the art without departing from the spirit and scope of the present invention and appended claims.

What is claimed is:

1. A method of forming an isolation layer of a flash memory device, the method comprising:

providing a semiconductor substrate in which a tunnel insulating film, a conductive film, and a first insulating film are formed in an active region, and a trench is formed in an isolation region;

forming a sidewall insulating film, a second insulating film, and a third insulating film so that the trench is gap filled, thus forming an isolation layer;

removing the first insulating film, wherein top surfaces of the third insulating film and the second insulating film are etched, and the top surfaces of the third insulating film and the sidewall insulating film remain in a projected shape; and performing an etch process so that a top of sidewalls of the conductive film is exposed as the projections of the third insulating film and the sidewall insulating film are removed.

2. The method of claim 1, wherein the sidewall insulating film is formed to a thickness of approximately 20 to 100 angstrom using an oxidization process of a radical method.

3. The method of claim 1, wherein the second insulating film is formed using a nitride film so that an underlying region of the trench is partially gap filled.

4. The method of claim 1, wherein the second insulating film is formed to a thickness of approximately 50 to 300 angstrom.

5. The method of claim 1, wherein the third insulating film is formed from polysilazane (PSZ) using a spin coating method.

6. The method of claim 1, wherein the third insulating film is formed to a thickness of approximately 3000 to 6000 angstrom at a temperature ranging from 350 to 400 degrees Celsius.

7. The method of claim 1, further comprising performing a curing process to densify the third insulating film after the third insulating film is formed.

8. The method of claim 7, wherein the curing process is performed at a temperature ranging from 300 to 500 degrees Celsius using a Catalythic Water Vapor Generator (c-WVG) method.

9. The method of claim 1, further comprising, after the third insulating film is formed:

etching the sidewall insulating film and the second and third insulating films using a Chemical Mechanical Polishing (CMP) process in order to form the isolation layer; and performing first and second curing processes after the isolation layer is formed.

10. The method of claim 9, wherein the first curing process is performed at a temperature ranging from 550 to 700 degrees Celsius using a c-WVG method.

11. The method of claim 9, wherein the second curing process is performed at a temperature ranging from 850 to 1000 degrees Celsius under a $N_2$ gas atmosphere.

12. The method of claim 1, wherein the first insulating film is removed using a wet etch process.

13. The method of claim 12, wherein the first insulating film is removed using a mixed solution of Buffered Oxide Etchant (BOE) and $H_3PO_4$.

14. The method of claim 1, wherein the projections of the third insulating film and the sidewall insulating film are removed using BOE.

15. The method of claim 1, further comprising performing a cleaning process after the process of removing the sidewall insulating film of the projected shape.

16. The method of claim 15, wherein at the time of the cleaning process, the third insulating film is etched, so that an Effective Field oxide Height (EFH) of the isolation layer is controlled.

17. The method of claim 15, wherein the cleaning process is performed using a HF solution in which $H_2O$:HF are mixed in a ratio of 100:1 to 500:1.

* * * * *